United States Patent
Lee

[19]

[11] Patent Number: 6,023,853
[45] Date of Patent: Feb. 15, 2000

[54] METHOD FOR CLEANING MOLDING COMPOUND TABLETS

[75] Inventor: Chang-Ho Lee, Asan, Rep. of Korea

[73] Assignee: Samsung Electronics Co., Ltd., Suwon, Rep. of Korea

[21] Appl. No.: 09/055,280

[22] Filed: Apr. 6, 1998

Related U.S. Application Data

[62] Division of application No. 08/802,768, Feb. 21, 1997.

[30] Foreign Application Priority Data

Feb. 23, 1996 [KR] Rep. of Korea .......................... 96-4336

[51] Int. Cl.⁷ ..................................................... F26B 19/00
[52] U.S. Cl. .................................. 34/236; 34/164; 34/92; 34/582; 134/5; 264/272.11
[58] Field of Search ............................... 34/359, 361, 366, 34/577, 580, 582, 92, 164, 236; 134/5, 21, 25.4, 32, 37, 42; 264/69, 328.14, 328.5, 328.4, 272.11

[56] References Cited

U.S. PATENT DOCUMENTS

| | | |
|---|---|---|
| 3,719,325 | 3/1973 | Cerva et al. ............................ 239/405 |
| 3,941,537 | 3/1976 | Abraham .................................. 425/228 |
| 4,534,921 | 8/1985 | Fierkens et al. ........................... 264/39 |
| 4,601,866 | 7/1986 | David et al. ............................. 264/109 |
| 4,787,436 | 11/1988 | Ozeki et al. ............................. 164/305 |
| 4,983,115 | 1/1991 | Yamasaki et al. ....................... 425/228 |
| 5,377,425 | 1/1995 | Kawakami et al. ........................ 34/92 |
| 5,431,784 | 7/1995 | Miyanoto et al. ....................... 162/275 |
| 5,509,539 | 4/1996 | Hoang et al. ............................ 209/634 |

Primary Examiner—William Doerrler
Assistant Examiner—Pamela A. Wilson
Attorney, Agent, or Firm—Jones Volentine, LLP

[57] ABSTRACT

A method for cleaning molding compound tablets while the molding compound tablets are transferred from a tablet container to a molding equipment for encapsulating a microelectronic device. The method includes the steps of loading the molding compound tablets from the tablet container to a tablet parts feeder; transferring the molding compound tablets from the tablet parts feeder to the molding equipment along the transfer line; blowing hot air downwardly on the molded compound tablets as they move along the transfer line; commencing melting of the molded compound tablet, and any contaminants on the molded compound, with the hot air, such that the contaminants are incorporated into a resulting soft tablet dough; and injecting the soft tablet dough into the molding equipment.

10 Claims, 1 Drawing Sheet

METHOD FOR CLEANING MOLDING COMPOUND TABLETS

CROSS REFERENCE TO RELATED APPLICATIONS

This is a divisional application of application Ser. No. 08/802,768, filed Feb. 21, 1997.

BACKGROUND OF THE INVENTION

1. Field of the Invention

The present invention relates generally to a method for cleaning molding compound tablets that are used for encapsulating semiconductor device packages, and an apparatus therefor. More particularly, the present invention relates to a method for removing dust and/or other contaminants from molding compound tablets that are used for encapsulating semiconductor device packages and an apparatus therefor.

2. Description of Relate Arts

The integrated circuit manufacturing process basically comprises wafer preparation, wafer fabrication, electric test (die sort) and assembly processes. In the wafer preparation process, a crystal of silicon is first ground to the required diameter, then a designated flat side is ground on, and then individual wafers are sawed from the crystal. Each raw wafer is polished to optical fatness and to the required thickness.

In the wafer fabrication process, the semiconductor device or integrated circuit (IC) is created in and on the wafer surface, which requires that a number of sophisticated processes be performed in a sequential manner. Although the actual number of steps the wafer goes through will vary depending on the type and complexity of the circuit being built during the wafer fabrication process, three basic operations are generally performed on the wafer: layering, where thin layers of different materials are grown on or added to the wafer surface; patterning, where portions of the thin layers are selectively removed from the wafer; and doping, where the resistivity and conductivity type of selected regions in the wafer are changed or altered by the addition of dopants.

After the electrically active regions are created through the doping sequences in the wafer surface, a metallization process is performed whereby the regions or components on and in the wafer surface are wired together. After this metallization process, the circuit or device is operationally complete. However, since the circuit is vulnerable to contamination and the thin fragile metallization layer is susceptible to scratching, the wafer is covered with a layer that acts as a contamination barrier and protects the metal layer.

After the water fabrication process, the wafer is separated into individual chips and mounted and connected to a chip package for the electrical die sort test. The good die which pass the tests are attached to a pad of a lead frame, and the chip is electrically connected to leads through wires.

Finally, the chip is encapsulated with a molding compound to give shape to the package body and to provide protection for the electrical interconnections and chip from exterior environmental stresses.

The molding operation is generally carried out using a molding press. Tablets of a molding compound are melted by increasing the temperature of the press, and the hot melted molding compound is injected and then cooled to room temperature to provide a package body. The molding compound is the most widely used plastic packaging material for encapsulating various types of microelectronic devices for commercial applications. Transfer molding is the process used almost exclusively with molding compounds.

A molding compound is a granulated powder that is normally used in the form of a tablet (preform). In a conventional transfer molding process, one molding time cycle takes between 60 seconds and a few minutes. It consumes one to several tablets, which are preheated to a temperature of about 66° C. with a radio frequency (RF) pre-heater until it achieves the consistency of a soft dough. These soft tablets are then used to encapsulate up to several hundred microelectronic devices using the conventional transfer molding press at a temperature of about 150 to 190° C. (300 to 375° F.) and a pressure of about 4.1 to 8.3 Mpa (0.600 to 1.20 ksi).

The tablets a-e stored until they are required for the molding process. However, the tablets may be stored for a considerable period of time, and during such storage, dusts or motes may contaminate them. These contaminants may in turn cause the formation of voids in the molded package body. As such, when they are introduced into the molding die, they may cause a change in the speed of molding compound that is flowing into the molding die, resulting in a non-homogeneous molded body. Further, the contaminants may accelerate the aging of the molding, press and cause erroneous operation of the sophisticated sensors of the automated molding equipment.

The tablet contamination problems described above account for more than 50% of the total tablet-related problems. Accordingly, cleaning of the molding compound tablets is very important for successful encapsulation.

To minimize possible contaminating particles on the tablets, various techniques such as air blowing, brushing, vacuum cleaning or vibrations are employed. All of these methods, however, only detach or drop the dust or other contaminants from the tablets. Therefore, the dusts may still fly or float in the air, and must later be removed by a vacuum cleaner after being collected. The flying dusts may contaminate the just cleaned wafer, especially when the vacuum system does not remove all the flying dusts.

FIG. 2 is a schematic diagram of conventional cleaning system for removing dusts or other contaminants from the molding compound tablets.

With reference to FIG. 2, the conventional cleaning system comprises a tablet container 14, e.g., a tablet hopper carrying molding compound tablets 18, and parts feeder 10, to which the tablets 8 are loaded from the container 14. Vacuum sweeper 16 is provided above the container 14 and the parts feeder 10. When a tablet 18 in the container 14 is loaded to the parts feeder 10, the vacuum sweeper 16 starts operating to suction the dusts or contaminants from the tablet 18.

The cleaned tablet 18 is transferred to transfer line 12, which moves the tablet 18 to molding equipment 20. The transfer line 12 may be provided with a vibrator 13 to vibrate the tablet 18 so as to detach contaminants from the tablet 18.

However, the dislodged dusts or contaminants are not necessarily removed from the tablet and they may still fly or float in the air around the tablet, and thus contaminate the tablet.

SUMMARY OF THE INVENTION

Thus, an object of the present invention is to remove dusts or any other contaminants from the molding compound tablets prior to using the tablets for encapsulating semiconductor device packages.

The above object can be accomplished by, for example, a process for cleaning the molding compound tablets by using a hot air blowing pre-heater. According to the present invention, a means is used to blow hot air, for example, at about 50 to 60° C., to melt or soften the dusts and the molding compound tablet so that the melted contaminants adhere to the softened tablet.

According to one aspect of the present invention, there is provided a method for cleaning molding compound tablets while the molding compound tablets are transferred from a tablet container to a molding equipment where a microelectronic device is encapsulated using the molding compound tablets, the method comprising steps of:

(a) loading the molding compound tablets from the tablet container to a tablet parts feeder, the tablet parts feeder being connected to a transfer line;

(b) transferring the molding compound tablets from the tablet parts feeder to the molding equipment along the transfer line;

(c) blowing hot air downwardly on the molded compound tablets as they move along the transfer line;

(d) commencing melting of the molded compound tablet, and any contaminants on the molded compound, with the hot air, such that the contaminants are incorporated into a resulting soft tablet dough; and (e) injecting the soft tablet dough into the molding equipment.

According to other aspect of the present invention, there is provided an apparatus for cleaning molding compound tablets while the molding compound tablets are transferred from a tablet container to a molding equipment where a microelectronic device is encapsulated with the molding compound tablets, the apparatus comprising: a tablet parts feeder to which the molding compound tablets are loaded from the tablet container; a transfer line for transferring the molding compound tablets from the tablet parts feeder to the molding equipment; and means for blowing hot air on the molding compound tablets as they move along the transfer line, wherein the molded compound tablets and any contaminants on the molded compound tablets are melted with the hot air, such that the contaminants are incorporated into a resulting soft tablet dough, the means for blowing hot air being separated a predetermined distance above the transfer line.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The present invention will now be described in greater detail with reference to accompanying drawings. For simplicity and ease of discussion, throughout the description of the invention and the claims, the term "contaminants" is generally used to refer to foreign particles, for example, dusts or motes, or any other foreign particles causing the contamination problems referred to in the above discussion.

Figure 1:
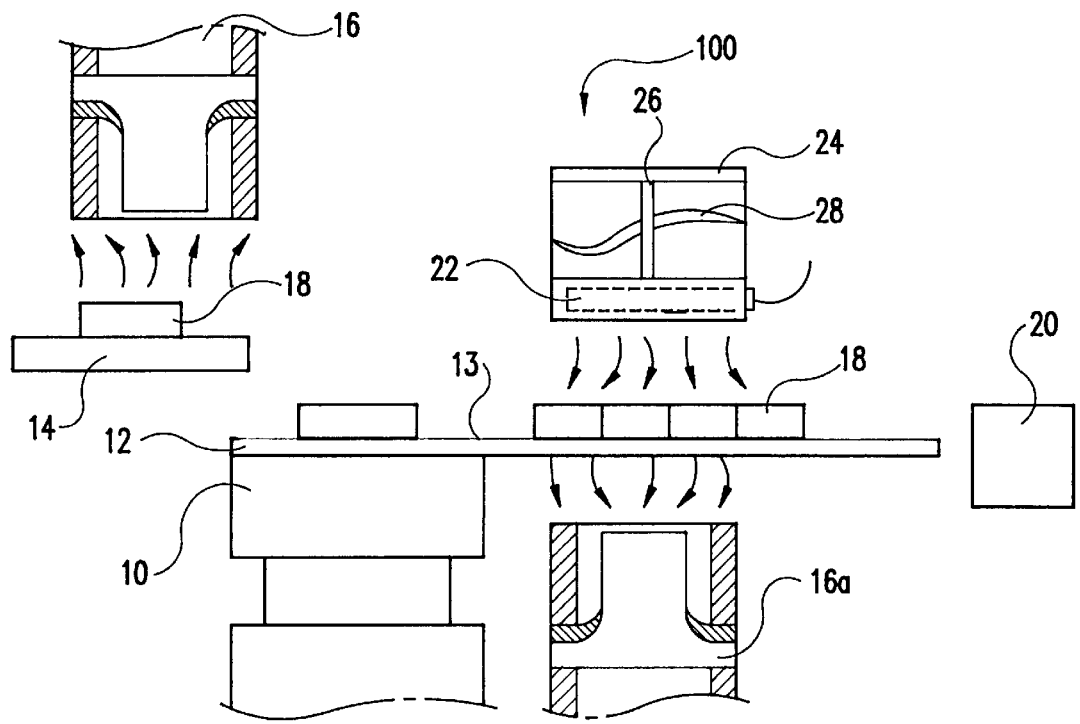
FIG. 1 is a schematic diagram of a cleaning system for removing dusts and other contaminants from the molding compound tablet according to the present invention.

According to one aspect of the present invention, there is provided an apparatus for cleaning a molding compound tablet during its transfer from a tablet container to a piece of molding equipment where a microelectronic device is encapsulated with the molding compound tablet. FIG. 1 is a schematic diagram of such a cleaning system for removing contaminants from the molding compound tablets according to the present invention.

Figure 2:
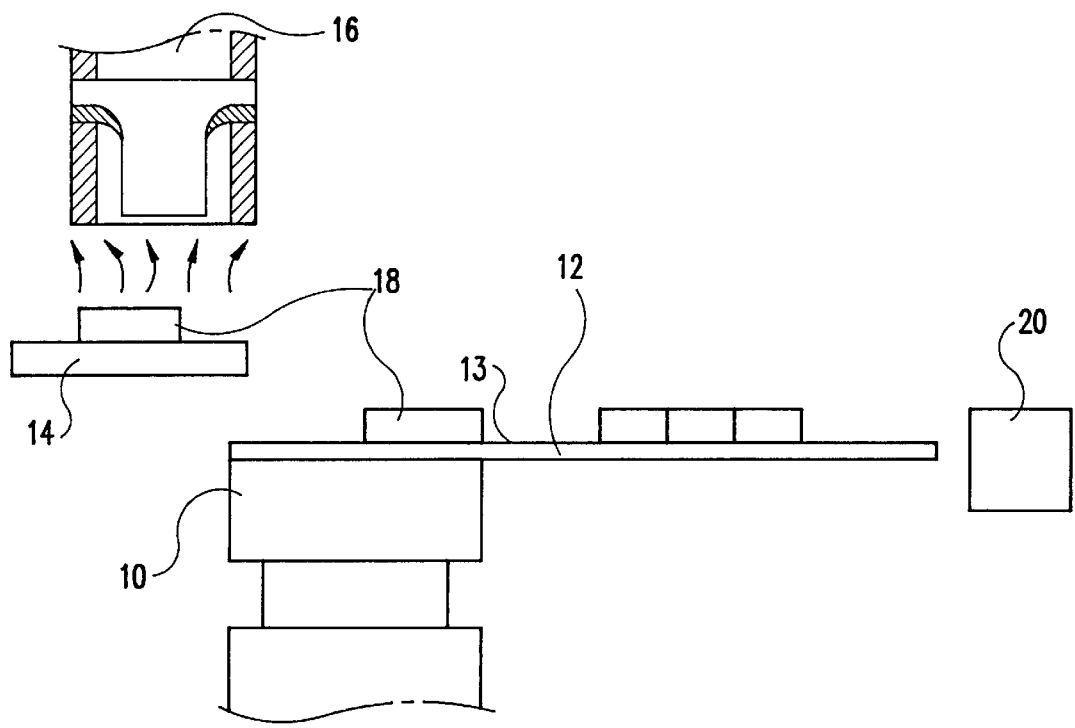
FIG. 2 is a schematic diagram of a conventional cleaning system for removing dusts and other contaminants from the molding compound tablets.

Referring to FIG. 1, it is shown that the cleaning system of the present invention has the same structure as that of the conventional one shown in FIG. 2, except that the present invention further incorporates a hot air blowing means 100 and an additional vacuum sweeper 16A. The embodiment of FIG. 1 also comprises a tablet container 14 which contains the molding compound tablets 18, and tablet parts feeder 10 to which the molding compound tablets 18 are loaded from the tablet container 14. Vacuum sweeper 16 is provided above the tablet container 14 and the parts feeder 10.

When a molding compound tablet 18 from the tablet container 14 is loaded to the parts feeder 10, the vacuum sweeper 16 starts operating to suction the contaminants from the tablet 18. This preliminarily cleaned tablet 18 is transferred to transfer line 12, for transferring the tablet 18 to molding equipment 20. A means for blowing 100 hot air blows air downwardly on the molded compound tablet 18 to begin to melt any contaminants on the molding compound tablet 18 as it also begins to melt the molding compound tablet 18. The hot air causes the molding compound tablet 18 to melt or soften to the consistency of a soft dough. The melted contaminants are thus incorporated into the soft dough.

As shown in FIG. 1, the means for blowing 100 is located above the transfer line 12. Also, as shown in FIG. 1, an additional vacuum sweeper 16A is incorporated in the present invention, and is located below the transfer line 12. The transfer line 12 may be provided with a vibrator 13 to facilitate a more efficient cleaning of the molding compound tablet 18.

In the embodiment shown in FIG. 1, the means for blowing 100 comprises, for example, a heating coil 22 for generating heat, rotating blades 28 located above the heating coil 22, a fixing plate 24, and a rotating shaft 26 fixed to the plate 24, which rotates the blades 28. The means for blowing 100 blows hot air of a predetermined temperature that ensures a melting or softening of the contaminants and the preliminarily cleaned tablet so that the contaminants are incorporated into the soft tablet dough and thus cannot fly or float in the air. In effect, the rotating blades 28 blow air over the heating coil 22 to create the hot air flow.

Even if there were any remaining free contaminants floating in the air, they can be removed by the additional vacuum sweeper 16A, which is located below the transfer line. In FIG. 1, the additional vacuum sweeper 16A is vertically aligned with the means for blowing 100, although it need not be. The vacuum sweeper 16A may also be operated by a power source different from that for the vacuum sweeper 16 located above the tablet parts feeder 10, although both vacuum sweepers may be operated by the same power source.

The method for cleaning the molding compound tablets 18 will be described hereinafter. The method of the present invention is based on the fact that the molding compound becomes a soft dough when a temperature of about 60° C. to 70° C. is applied and is completely melted at a temperature of about 175° C. Once the molding compound is molded at a temperature of about 175° C., it does not transform any further, but, tends to break if a temperature greater than 175° C. is applied. The contaminants on the molding compound tablet 18 can generally be incorporated in the soft dough by heating the tablet to a temperature of about 50° C. to about 60° C.

In the present invention, when a molding compound tablet 18 in the tablet container 14 is loaded to the tablet parts feeder 10, the vacuum sweeper 16 starts operating to initially suction the contaminants from the tablet 18. This preliminarily cleaned tablet 18 is then transferred to transfer line 12, which moves the tablet to the molding equipment 20. As described above, however, contaminants may still remain on the tablet 18, even after the initial vacuum suctioning process.

After the tablet 18 is loaded onto the transfer line 12, the means for blowing 100 hot air, which is located a predetermined vertical distance above the transfer line 12, starts to blow hot air downwardly over the tablet to begin to melt or soften the tablet. The temperature of hot air is between about 50° C. and about 60° C. The particular temperature may vary, however, depending on the type of the molding compound tablet 18 utilized.

The transfer line 12 may be provided with a vibrator 13, which detaches contaminants from the molding compound tablet 18 on the transfer line 12. The operation of the blowing means 100 can be controlled so as to be in synchronization with the vibration of the transfer line 12.

The operating time for the blowing means 100 is important, since too long a time of operation may cause chemical reactions within the molding compound tablet 18, resulting in a quality deterioration of the tablet. Therefore, for example, the blowing means 100 can be constructed to start operating when the transfer line 12 starts vibrating upon the loading of the tablet 18 thereon, and to stop operating when the transfer line 12 stops vibrating after the tablet 18 passes through the blowing means 100. The cycle time is generally on the order of one to ten minutes.

The contaminants and the molding compound tablet 18 are sufficiently melted or softened by the hot air from the blowing means 100, and the contaminants are incorporated into the softened tablet and thus cannot fly or float in the air.

Even if there remain any free contaminants floating in the air, they can be removed by using the additional vacuum sweeper 16A, which is located below the transfer line 12 as described above. The sweeper 16A also suctions the hot air blown from the blowing means 100. According to the present invention, therefore, the contaminants on the molding compound tablet can be effectively removed by pre-heating the tablet using a hot air blower.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims and their equivalents.

What is claimed is:

1. An apparatus for cleaning molding compound tablets while said molding compound tablets are transferred from a tablet container to a molding equipment where a microelectronic device is encapsulated with the molding compound tablets, said apparatus comprising:

a tablet parts feeder to which the molding compound tablets are loaded from the tablet container;

a transfer line for transferring the molding compound tablets from the tablet parts feeder to the molding equipment; and means for blowing hot air on the molding compound tablets as they move along the transfer line, wherein the molded compound tablets and any contaminants on the molded compound tablets are melted with the hot air, such that the contaminants are incorporated into a resulting soft tablet dough, said means for blowing hot air being separated a predetermined distance above the transfer line.

2. The apparatus of claim 1, further comprising:

a vacuum sweeper for suctioning free contaminants from around the molding compound tablet on the transfer line, said vacuum sweeper being located below the transfer line.

3. The apparatus of claim 2, wherein said vacuum sweeper below the transfer line is vertically aligned with the means for blowing the hot air above the transfer line.

4. The apparatus of claim 2, wherein said transfer line includes a vibrator.

5. The apparatus of claim 4, wherein said hot air has a temperature of about 50° C. to about 60° C.

6. The apparatus of claim 2, wherein said hot air has a temperature of about 50° C. to about 60° C.

7. The apparatus of claim 1, wherein said transfer line includes a vibrator.

8. The apparatus of claim 7, wherein said hot air has a temperature of about 50° C. to about 60° C.

9. The apparatus of claim 1, wherein said hot air has a temperature of about 50° C. to about 60° C.

10. The apparatus of claim 1, wherein said means for blowing comprises:

a heating coil for generating heat; and rotating blades located above the heating coil and fixed to a rotating shaft, said rotating shaft being attached to a fixing plate located above the rotating blades.

* * * * *